US011882680B2

(12) United States Patent
Scheffer et al.

(10) Patent No.: US 11,882,680 B2
(45) Date of Patent: Jan. 23, 2024

(54) ELECTROMAGNETIC INTERFERENCE SHIELDING STRUCTURES

(71) Applicant: Vorbeck Materials Corp., Jessup, MD (US)

(72) Inventors: Dan Scheffer, Frederick, MD (US); Kate Redmond, Baltimore, MD (US); Trentice Bolar, Columbia, MD (US)

(73) Assignee: VORBECK MATERIALS CORP., Jessup, MD (US)

( * ) Notice: Subject to any disclaimer, the term of this patent is extended or adjusted under 35 U.S.C. 154(b) by 0 days.

(21) Appl. No.: 17/986,529

(22) Filed: Nov. 14, 2022

(65) Prior Publication Data

US 2023/0180446 A1    Jun. 8, 2023

Related U.S. Application Data

(60) Provisional application No. 63/247,753, filed on Sep. 23, 2021.

(51) Int. Cl.
*H05K 9/00*    (2006.01)
(52) U.S. Cl.
CPC ......... *H05K 9/0007* (2013.01); *H05K 9/0081* (2013.01)
(58) Field of Classification Search
CPC .................................................. H05K 9/0003
See application file for complete search history.

(56) References Cited

U.S. PATENT DOCUMENTS

| | | | | |
|---|---|---|---|---|
| 5,229,773 A * | 7/1993 | Dauwen | ................ | H05K 9/009 342/4 |
| 5,545,844 A * | 8/1996 | Plummer, III | ....... | H05K 9/0043 174/363 |
| 5,728,346 A * | 3/1998 | Haq | ....................... | H05K 9/009 264/254 |
| 6,111,192 A * | 8/2000 | Bell | ..................... | H05K 9/0001 361/818 |
| 6,696,639 B1 * | 2/2004 | Nurmi | .................. | H05K 9/0015 174/363 |
| 10,426,068 B1 * | 9/2019 | Danielson | ............ | H05K 9/0043 |

(Continued)

FOREIGN PATENT DOCUMENTS

CN    110708943    *    1/2020

*Primary Examiner* — Hung V Ngo
(74) *Attorney, Agent, or Firm* — 8XUM IP LLC; Trent V. Bolar

(57) ABSTRACT

Embodiments of the present invention relate to electromagnetic interference (EMI) shielding structures. Rectangular EMI shielding panels are formed that include a first and second ends. A pair of rectangular EMI shielding panels are affixed orthogonal to each other at their first ends. The pair of rectangular EMI shielding panels are successively overlapped with each other to thereby form a plurality of interconnected EMI shielding planes. The pair of rectangular EMI shielding panels are affixed to each other at their second ends to form a helical EMI shielding structure that unfolds to an unfolded state and folds to a folded state along its center axis. Here, the plurality of interconnected EMI shielding planes are each angularly offset from each other about the center axis to form a helical structure when in the unfolded state. The EMI shielding panels include an encapsulating layer and/or metallic layer.

19 Claims, 19 Drawing Sheets

(56) References Cited

U.S. PATENT DOCUMENTS

| | | | |
|---|---|---|---|
| 11,665,872 B2* | 5/2023 | Chen | H05K 9/0052 |
| | | | 174/380 |
| 2006/0246261 A1* | 11/2006 | Kasabo | B32B 29/08 |
| | | | 428/182 |
| 2022/0192062 A1* | 6/2022 | Babhadiashar | H05K 9/0003 |

* cited by examiner

ELECTROMAGNETIC INTERFERENCE SHIELDING STRUCTURES

CROSS-REFERENCE TO RELATED APPLICATIONS

This application claims priority to U.S. Provisional Application No. 63/247,753 filed Sep. 23, 2021. The application is hereby incorporated herein by reference.

BACKGROUND

The present invention relates generally to electromagnetic interference ("EMI") and specifically to EMI shielding structures. All electronics emit some level of radio frequency known as "electromagnetic radiation". EMI occurs in the radio frequency spectrum when there is a disturbance generated by an external source that affects an electrical circuit by electromagnetic induction, electrostatic coupling, or conduction. In communication devices (e.g., cell phones, computers, Bluetooth devices, laptops), commercial appliances (i.e., microwave ovens, the design of microwave circuits) and the automotive industries (i.e., integrated electrical circuits), EMI deteriorates the durability and proper functioning of electronic equipment.

EMI shielding is defined in terms of the reflection and/or absorption of EM radiation by a material that acts as a barrier against the penetration of the radiation passing through the shielding materials. These materials prevent the transmission of EM radiation by reflection and/or absorption of the EM radiation or by suppressing the EM signals so that EM waves do not affect the functioning and durability of electronic equipment. There exists a need in the space for three-dimensional structures that absorb and/or reflect EMI radiation.

DETAILED DESCRIPTION

Figure 1:
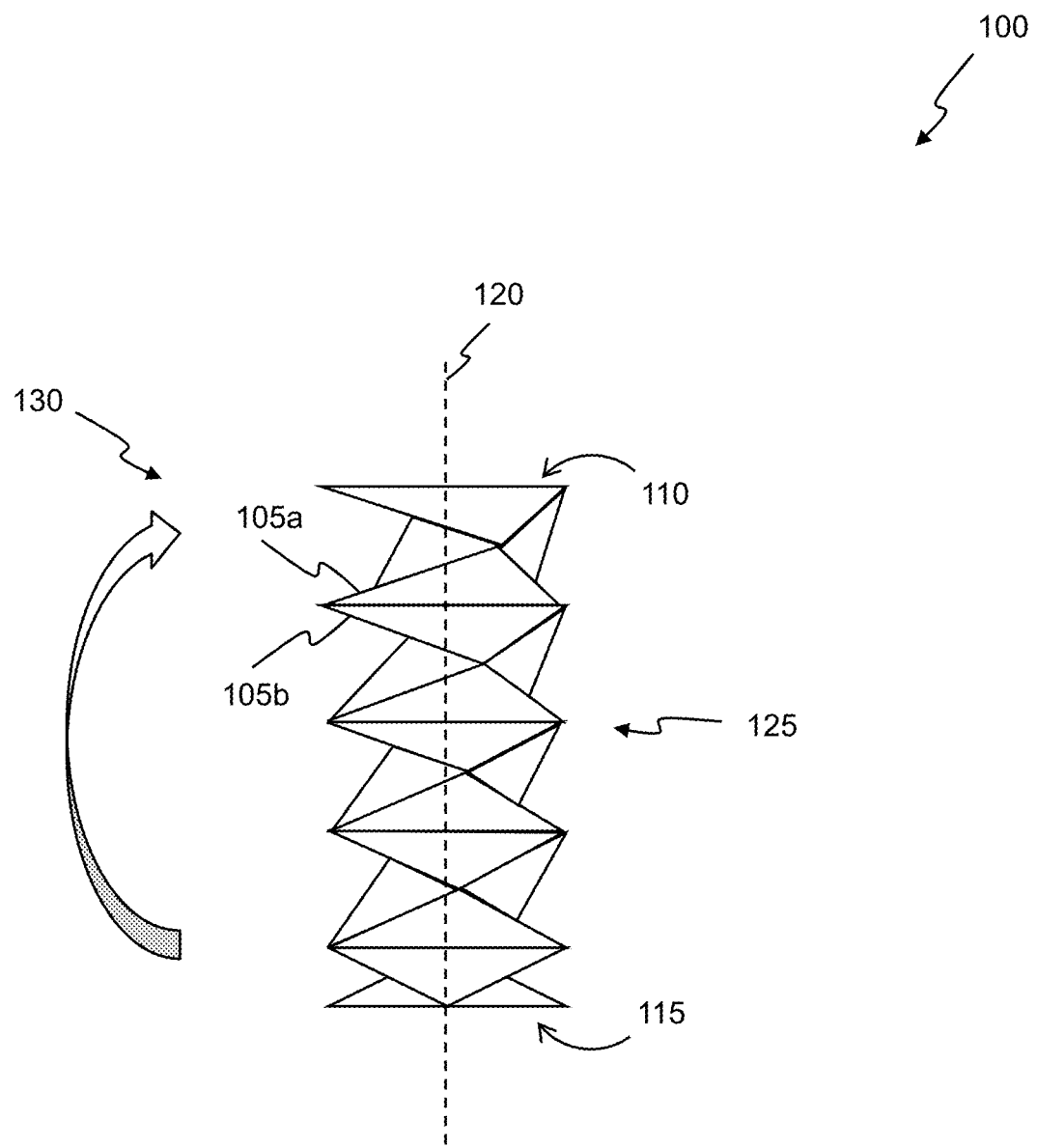
FIG. 1 illustrates a side view of a hexagonal electromagnetic interference shielding ("HES") structure in an unfolded state, generally 100, in accordance with some embodiments.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Certain terminology may be employed in the following description for convenience rather than for any limiting purpose. For example, the terms "forward" and "rearward," "front" and "rear," "right" and "left," "upper" and "lower," and "top" and "bottom" designate directions in the drawings to which reference is made, with the terms "inward," "inner," "interior," or "inboard" and "outward," "outer," "exterior," or "outboard" referring, respectively, to directions toward and away from the center of the referenced element, the terms "radial" or "horizontal" and "axial" or "vertical" referring, respectively, to directions or planes which are perpendicular, in the case of radial or horizontal, or parallel, in the case of axial or vertical, to the longitudinal central axis of the referenced element, and the terms "downstream" and "upstream" referring, respectively, to directions in and opposite that of fluid flow. Terminology of similar import other than the words specifically mentioned above likewise is to be considered as being used for purposes of convenience rather than in any limiting sense.

In the figures, elements having an alphanumeric designation may be referenced herein collectively or in the alternative, as will be apparent from context, by the numeric portion of the designation only. Further, the constituent parts of various elements in the figures may be designated with separate reference numerals which shall be understood to refer to that constituent part of the element and not the element as a whole. General references, along with references to spaces, surfaces, dimensions, and extents, may be designated with arrows. Angles may be designated as "included" as measured relative to surfaces or axes of an element and as defining a space bounded internally within such element therebetween, or otherwise without such designation as being measured relative to surfaces or axes of an element and as defining a space bounded externally by or outside of such element therebetween. Generally, the measures of the angles stated are as determined relative to a common axis, which axis may be transposed in the figures for purposes of convenience in projecting the vertex of an angle defined between the axis and a surface which otherwise does not extend to the axis. The term "axis" may refer to a line or to a transverse plane through such line as will be apparent from context.

The present invention relates generally to electromagnetic interference ("EMI") and specifically to EMI shielding structures. All electronics emit some level of radio frequency known as "electromagnetic radiation". EMI occurs in the radio frequency spectrum when there is a disturbance generated by an external source that affects an electrical circuit by electromagnetic induction, electrostatic coupling, or conduction. In communication devices (e.g., cell phones, computers, Bluetooth devices, laptops), commercial appliances (i.e., microwave ovens, the design of microwave circuits) and the automotive industries (i.e., integrated electrical circuits), EMI deteriorates the durability and proper functioning of electronic equipment.

A number of solutions have been developed over the years to combat these undesired signals. For example, there are two types of EMI shielding: conductive coatings and EMI mesh. Transparent conductive coatings typically offer less than 40 dB EMI emission attenuation with a sheet resistance from 1 to 100 Ω/sq. EMI mesh (e.g., wire mesh, micromesh, and laser mesh) usually offers 60-80 dB of EMI emission attenuation and conductivity of less than 0.3 Ω/sq. Each option offers varying levels of light transmission, attenuation, and sheet resistance. EMI filters can be tuned for a specific frequency. For example, the effectiveness of an EMI shield can be determined by testing the level of the signal passing through the aperture (measured in decibels "dB") before and after fitting the shield then comparing the difference.

EMI shielding is defined in terms of the reflection and/or absorption of EM radiation by a material that acts as a barrier against the penetration of the radiation passing through the shielding materials. These materials prevent the transmission of EM radiation by reflection and/or absorption of the EM radiation or by suppressing the EM signals so that EM waves do not affect the functioning and durability of electronic equipment. In general, conductive materials like metals, owing to their high reflectivity, are widely used to isolate spaces or equipment from surrounding EM waves. This reflection shielding is based on the principle of the Faraday cage, in which inside the cage, space is completely impervious to external electric fields.

On the other hand, absorption shielding is related to permeable materials (i.e., magnetic materials). Accordingly, metallic conductors suffer a lack of flexibility, heaviness, and high costs. Meanwhile, ferromagnetic or ferrimagnetic materials have an intrinsic cut-off frequency, usually below the low GHz range, that hinders their use in EMI shielding over a broad GHz range. There exists a need in the space for three-dimensional ("3D") structures that absorb and/or reflect EMI radiation over a broad GHz range that is flexible, light weight, low cost, and is capable of 60-80 dB of EMI emission attenuation and conductivity of less than 0.3 Ω/sq.

Embodiments of the instant disclosure seek to provide EMI shielding structures that can be assembled in a variety of 3D EMI shielding constructs (e.g., walls, curtains, dividers, panels, liners, barriers, etc.) that can be used, for example, to shield rooms, buildings, sheds, tents, storage containers, as well as other 3D structures. The 3D EMI shielding constructs of the instant disclosure can also be assembled into 3D EMI shielding structures (e.g., rooms, building, sheds, as well as other structures having a roof and walls). Other aspects of the instant disclosure seek to provide multifaceted EMI shielding structures that utilize various layers of metals, conductive inks, and fabrics. The instant disclosure further seeks to provide helical EMI shielding structures that have a folded state and an unfolded state.

Shielding efficiency ($SE_T$) is typically defined as a parameter that measures how well a material impedes the EM energy of a certain frequency when passing through it. When the EM waves fall on the front-face of the shielding material then a certain part of the incident power ($P_I$) is reflected ($P_R$), while a certain part is absorbed and dissipated in form of energy, and the remaining part is transmitted ($P_T$) through the shielding material. Therefore, three different processes namely reflection, absorption and multiple internal reflections contribute to the whole attenuation, corresponding to shielding effectiveness $SE_R$, $SE_A$ and $SE_M$, respectively ([EQ. 1]).

$$SE_T = 10\log\frac{P_I}{P_T} = 20\log\frac{E_I}{E_T} = 20\log\frac{H_I}{H_T} = SE_R + SE_A + SE_M \quad \text{[EQ. 1]}$$

Here P, E and H refer to power and electric and magnetic field intensities while subscripts I, R and T represent the incident, reflected and transmitted components, respectively. Thus, $SE_R$ refers to net reflection and $SE_A$ represents shielding due to absorption. The primary mechanism of EMI shielding is reflection. Reflection loss ($SE_R$) is related to the relative impedance mismatching between the surface of the shielding material and the EM waves. $SE_R$ is a function of the ratio of conductivity and permeability of the material. Therefore, materials must have mobile charge carriers (electrons or holes) for reflection of the EM radiation.

A secondary mechanism of EMI shielding is absorption. As obtained from the plane wave theory, the amplitude of the EM wave decreases exponentially inside the material as it passes through it. Absorption loss results from ohmic losses and heating of the material due to the currents induced in the medium. $SE_A$ is directly related to conductivity, permeability and sample thickness (i.e., EMI absorption is proportional to sample thickness). Such a dependency of $SE_R/SE_A$ on μ (permeability) and σ (conductivity) indicates that in magnetic conducting metals, shielding is dominated by absorption rather than reflection. For thinner materials, radiation is trapped between two boundaries due to multiple reflection (i.e., EM waves reflect from the second boundary, come back to first boundary and are re-reflected from the first to second boundary, and so on).

Multiple reflection plays an important role for porous structures and some definite geometries. Here, a large surface area and a big vacant space excluding the solid structure gives more active sites for scattering and multiple reflection of electromagnetic waves. The hollow/porous structure shows unique properties, e.g., high surface area, disciplinable internal structures, low density and complimentary permeability that can fulfil the quest for improving EMI shielding performance. These multiple reflections ($SE_M$) can be neglected when the thickness of the shielding materials is greater than the penetration depth or when $SE_A$ is more than 10 dB because in thick shielding materials (high $SE_A$) the EM wave hits at the second boundary with negligible amplitude so $SE_M$ can be neglected.

Therefore, there is a complex dependency on the geometry, size, conductivity and volume fraction of each constituent. For example, the essential requirement is to adjust the effective permittivity and permeability to certain values by which reflection can be minimized. Therefore, a prerequisite of conductive EMI shielding composites is to limit reflection and enhance absorption for effective EMI shielding materials.

Given the important role electrical conductivity plays in shielding effectiveness, shielding materials are typically made of metals such as copper, aluminum, brass, nickel, silver, steel, and tin in the form of foils, screens, films, braids, foams, and enclosures. Although effective, the use of metals alone as EMI shielding material possess many disadvantages compared to solutions that incorporate conductive compositions of the instant disclosure (e.g., greater weight, higher costs, reduced flexibility, and increased susceptibility to corrosion). The EMI shielding structures of the instant disclosure utilize a conductive composition that includes a polymer(s) and fully exfoliated single sheets of graphene and provides EMI shielding without the drawbacks of using metals alone.

Turning now to the Figures. FIG. 1 illustrates a side view of a hexagonal electromagnetic interference shielding ("HES") structure in an unfolded state 130, generally 100, in accordance with some embodiments. The HES structure 100 includes a plurality of interconnected EMI shielding planes 105 (e.g., EMI shielding panels 105a is interconnected to EMI shielding panels 105b). Specifically, each plurality of interconnected EMI shielding planes 105 includes a pair of rectangular EMI shielding panels 200. The HES structure 100 includes a top end 110 and an oppositely positioned bottom end 115. The HES structure 100 has a helical structure 125 due to the manner in which the interconnected EMI shielding planes 105 are connected and positioned relative to each other.

Figure 2:
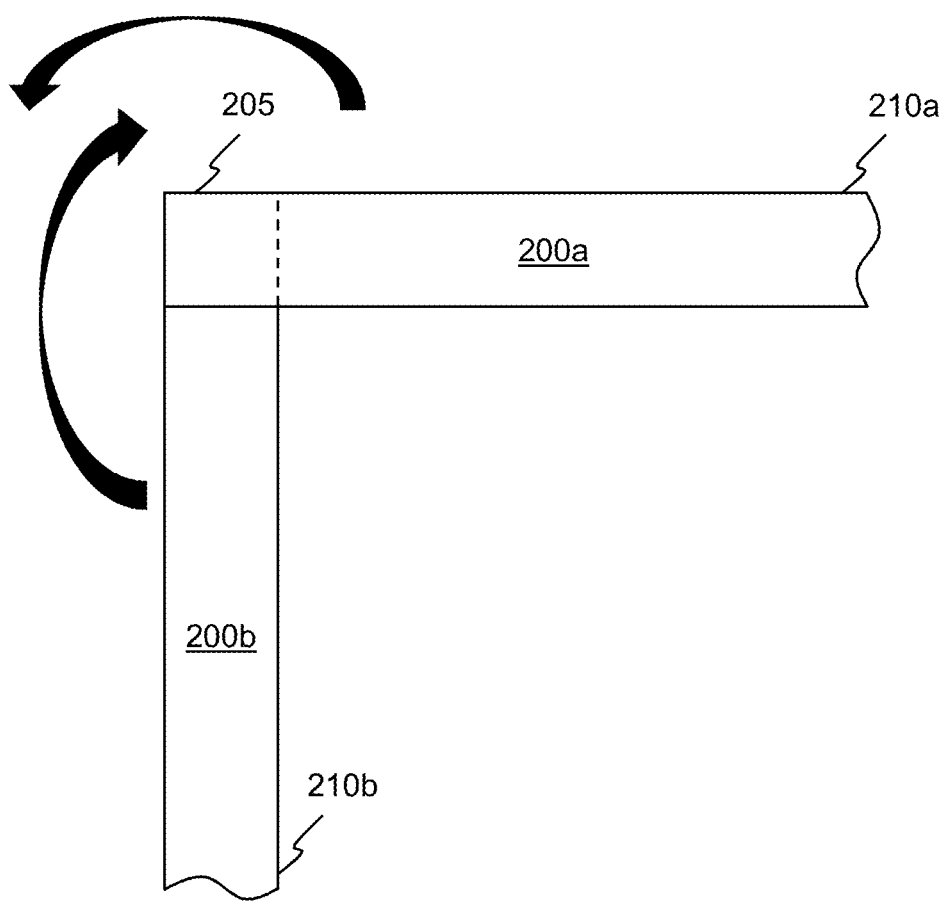
FIG. 2 illustrates a top view EMI shielding panels orthogonally positioned at their first end and their method successively folding over each other to form the HEX structure 100, in accordance with other embodiments.

FIG. 2 illustrates a top view of the EMI shielding panels 200 orthogonally positioned at their first end 205 and their method of successively folding over each other to form the HEX structure 100, in accordance with other embodiments. Each EMI shielding panel 200 includes a first end 205 and a second end 210. To form an HES structure 100, a pair of EMI shielding panels 200 are affixed orthogonal to each other at their first ends 205 and successively overlapped with each other to thereby form the plurality of interconnected EMI shielding planes 105. Subsequently, the EMI shielding panels 200 are affixed at their second ends 210 to thereby form the HES structure 100, which unfolds to an unfolded state 130 (depicted in FIG. 1) and folds to a folded state 505 (depicted in FIG. 5) along its center axis 120. As depicted in FIG. 1, the plurality of interconnected EMI shielding planes 105 are each angularly offset from each other about the center axis 120 to form the helical structure 125 when in the unfolded state 130.

Figure 3:
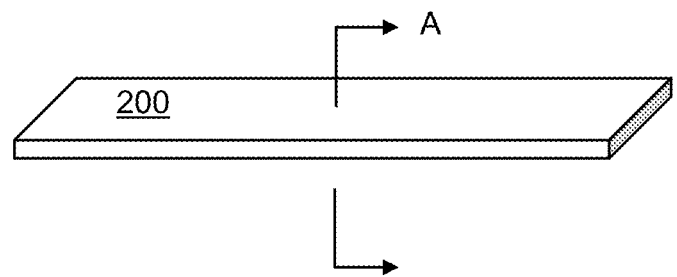
FIG. 3 illustrates a perspective view of an EMI shielding panel, generally 200, and View A, according to certain embodiments.

FIG. 3 illustrates a perspective view of the EMI shielding panel 200 and View A, according to certain embodiments. The EMI shielding panel 200 is preferably multilayered to not only provide EMI shielding but also provide structural as well as environmental integrity. For example, since the HES structure 100 includes folded EMI shielding panels 200, the HES structures must have reduced corrosion susceptibility compared to metal EMI shielding structures and in light of their inclusion in 3D constructs and 3D structures (discussed further below) they preferably should be able to form and hold predetermined contours.

Figure 4:
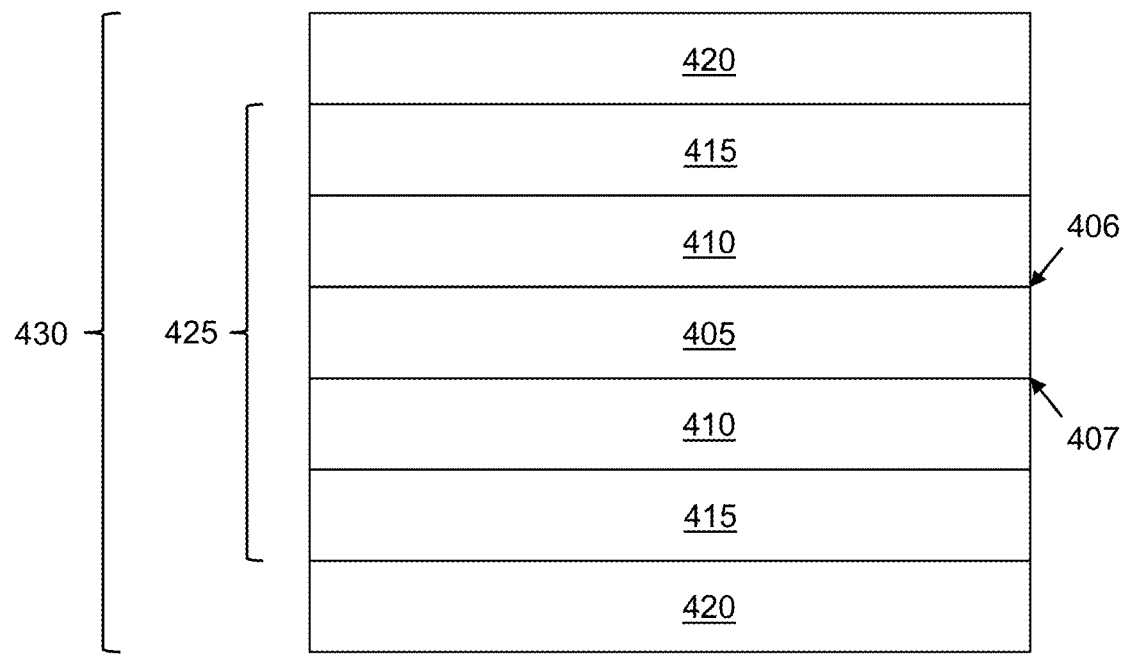
FIG. 4 illustrates View A, which depicts a cross-section of EMI shielding panel 200 that reflects a multilayered structure, in accordance with yet still other embodiments.

FIG. 4 illustrates View A, which depicts a cross-section of the EMI shielding panel 200 that reflects a multilayered structure (e.g., a laminate), in accordance with yet still other embodiments. The EMI shielding panel 200 preferably includes a substrate 405, at least one conductive layer 410 positioned proximate to on one or more sides (e.g., a side 406 and/or oppositely positioned side 407) of the substrate 405. Depending on which layers are present, an encapsulating layer 415 can be positioned proximate to the conductive layer 410, the substrate 405, and/or the conductive layer 410. In other words, the encapsulating layer 415 encapsulates the layers that are present EMI shielding panel 200. In some embodiments, a metallic substrate 420 can be proximate to the conductive layer 410, the substrate 405, the conductive layer 410, and/or the encapsulating layer 415.

View A depicts one of many configurations that the EMI shielding panel 200 can assume. In preferred embodiments, the EMI shielding panel 200 is a laminate that includes at least one substrate and a plurality of layers. Here, the substrate 405 includes the conductive layer 410 positioned proximate to the first side 406 and the second side 407. The substrate 405 can include films (e.g., PET, polyethylene, polyetherimides, polyurethanes, thermoplastic polyurethanes, and other polymeric films) as well as woven and/or unwoven fabrics (e.g., nylons, cotton, rayon, metallic fibers).

An encapsulating layer 415 is positioned proximate to each of the conductive layers 410 to thereby form an encapsulating body 425. A metallic substrate 420 is positioned proximate to each side of the encapsulating body 425 (i.e., proximate to each of the encapsulating layers 415) and thereby forms a shrouded body 430. The shrouded body 430 is subsequently rectangular parsed to form the EMI shielding panels 200. In embodiments that lack the metallic substrate 420, the encapsulating body is parsed to form the EMI shielding panels 200.

The conductive composition in the form of the conductive layer 410 can be applied as a coating or a preformed layer(s). When applied as a coating, the conductive layer 410 is preferably cured before that addition of subsequent layers. For example, the conductive layer 410 can be applied using one or more coating methods known in the art (e.g., screen printing, vapor deposition, electrochemical techniques, spraying, roll-to-roll coating, physical coating, and/or other coating techniques known in the art). The conductive layer 410 can include one or more layers of the conductive composition where each layer can be up to 80 nm thick. The conductive layer 410 can be pre-formed using a mold, a cast, a punch, and/or similar manufacturing techniques. Such pre-formed conductive layers 410 can subsequently be cured. The substrate 405 is preferably planar, flexible, and includes a film and/or fabric.

Preferably, the conductive composition (including applicable polymers and methods of manufacture) as well as the fully exfoliated single sheets of graphene can be prepared as disclosed in U.S. Pat. No. 7,658,901 B2 to Prud'Homme et al., U.S. Pat. No. 8,679,485 B2 to Crain et al., U.S. Pat. No. 8,278,757 B2 to Crain et al., and U.S. Patent Application No. 2011/0189452 A1 to Lettow et al., which are each herein incorporated in their entirety. The graphene sheets preferably have a maximum surface area of 2630 $m^2/g$, in accordance with certain embodiments. In several embodiments, the graphene sheets are present in the polymer as a three-dimensional percolated network (e.g., a continuous three-dimensional network comprising continuous chains of graphene sheets).

Applicable polymers include, but are not limited to, silicone, polyurethane, polyester, polyethylene, polypropylene, polystyrene, polyurea, polyimide, polyamide, polyethylene terephthalate, polycarbonate, polyvinylchloride, polyether ether ketone, acrylonitrile butadiene styrene, polylactic acid, methacrylate, epoxy, phenolics, rubber, and similar polymers. In certain embodiments, conductive layers 410 may be formed by one or more currently available methods, such as extruding, calendaring, and pressing.

In some embodiments, the conductive composition can further include one or more electromagnetic absorbing material (e.g., carbon black, graphite, graphite oxide, expanded graphite, carbon fibers, carbon nanotubes, etc.) uniformly dispersed within the polymer matrix. The conductive composition includes fully exfoliated graphene sheets dispersed in one or more polymers and may include additional components such as emulsifiers, solvents, dispersion aids, etc. In other embodiments, the three-dimensional percolated network comprises a graphene sheet network comprising nanometer scale separation at the contact points between individual sheets. In yet still other embodiments, individual graphene sheets may comprise imperfections in its lattice network (i.e., kinks) that facilitate the interlocking of individual graphene sheets in the percolated network.

Structurally, graphene has hybrid orbitals formed by $sp^2$ hybridization. In the $sp^2$ hybridization, the 2s orbital and two of the three 2p orbitals mix to form three $sp^2$ orbitals. The one remaining p-orbital forms a pi-bond between the carbon atoms. Similar to the structure of benzene, the structure of graphene has a conjugated ring of the p-orbitals which exhibits a stabilization that is stronger than would be expected by the stabilization of conjugation alone, i.e., the graphene structure is aromatic. Unlike other allotropes of carbon such as diamond, amorphous carbon, carbon nanofoam, or fullerenes, graphene is not an allotrope of carbon since the thickness of graphene is one atomic carbon layer i.e., a sheet of graphene does not form a three-dimensional crystal.

Graphene has an unusual band structure in which conical electron and hole pockets meet only at the K-points of the Brillouin zone in momentum space. The energy of the charge carriers, i.e., electrons or holes, has a linear dependence on the momentum of the carriers. As a consequence, the carriers behave as relativistic Dirac-Fermions having an effective mass of zero and moving at the effective speed of light of 106 msec. Their relativistic quantum mechanical behavior is governed by Dirac's equation. As a consequence, graphene sheets have a large carrier mobility of up to 60,000 $cm_2$/V-sec at 4K at 300K, the carrier mobility is about 15,000 $cm_2$/V-sec. Also, quantum Hall effect has been observed in graphene sheets.

The linear dispersion of graphene around the K (K') point leads to constant interband absorption (from valence to conduction bands, about 2.3%) of vertical incidence light in a very broadband wavelength range. More interestingly, at the microwave and terahertz frequency ranges, intraband absorption dominates and a single layer can absorb as much as 30% at a light wavelength of 300 microns depending on the carrier concentration in the. As a result, utilization of graphene for microwave and terahertz frequency absorption has numerous advantages such as being an ultra-thin and efficient absorption layer relative to other materials.

Moreover, because graphene is a one atom thick monolayer sheet formed of carbon atoms packed in a honeycomb crystalline lattice, wherein each carbon atom is bonded to three adjacent carbon atoms via $sp^2$ bonding, the overall thickness required to provide effective absorption is minimal on the order of a few nanometers. As such, the use of graphene sheets provides minimal added weight to the object to be shielded, has broadband absorption capabilities, and provides greater versatility than prior art structures. Moreover, graphene is generally recognized for its high mechanical strength and high stability which are desirable properties for most applications.

Examples of polymeric materials include, but are not limited to, those comprising thermoplastics and thermosets, including elastomers and rubbers (including thermoplastics and thermosets), silicones, fluorinated polysiloxanes, natural rubber, butyl rubber, chlorosulfonated polyethylene, chlorinated polyethylene, styrene/butadiene copolymers (SBR), styrene/ethylene/butadiene/stryene copolymers (SEBS), styrene/ethylene/butadiene/stryene copolymers grafted with maleic anhydride, styrene/isoprene/styrene copolymers (SIS), polyisoprene, nitrile rubbers, hydrogenated nitrile rubbers, neoprene, ethylene/propylene copolymers (EPR), ethylene/propylene/diene copolymers (EPDM), ethylene/vinyl acetate copolymer (EVA), hexafluoropropylene/vinylidene fluoride/tetrafluoroethylene copolymers, tetrafluoroethylene/propylene copolymers, fluorelastomers, polyesters (such as poly(ethylene terephthalate), poly(butylene terephthalate), poly(ethylene naphthalate), liquid crystalline polyesters, poly(lactic acid), etc.); polystyrene; polyamides (including polyterephthalamides); polyimides (such as Kapton®); aramids (such as Kevlar® and Nomex®); fluoropolymers (such as fluorinated ethylene propylene (FEP), polytetrafluoroethylene (PTFE), poly(vinyl fluoride), poly(vinylidene fluoride), etc.); polyetherimides; poly(vinyl chloride); poly(vinylidene chloride); polyurethanes (such as thermoplastic polyurethanes (TPU); spandex, cellulosic polymers (such as nitrocellulose, cellulose acetate, etc.); styrene/acrylonitriles polymers (SAN); arcrylonitrile/butadiene/styrene polymers (ABS); polycarbonates; polyacrylates; poly(methyl methacrylate); ethylene/vinyl acetate copolymers; thermoset epoxies and polyurethanes; polyolefins (such as polyethylene (including low density polyethylene, high density polyethylene, ultrahigh molecular weight polyethylene, etc.), polypropylene (such as biaxially-oriented polypropylene, etc.); Mylar; etc.

The substrate can be non-woven materials, such as DuPont Tyvek®. The substrate can be adhesive or adhesive-backed materials (such as adhesive-backed papers or paper substitutes). The substrate can be mineral-based paper substitutes such as Teslin® from PPG Industries. The substrate can be a transparent or translucent or optical material, such as glass, quartz, polymer (such as polycarbonate or poly (meth)acrylates (such as poly(methyl methacrylate).

For example, components of the nanocomposites disclosed herein, such as two or more of the functionalized graphene sheets, binders, carriers, and/or other components may be blended by using suitable mixing, dispersing, and/or compounding techniques and apparatus, including ultrasonic devices, high-shear mixers, two-roll mills, three-roll mills, cryogenic grinding crushers, extruders, kneaders, double planetary mixers, triple planetary mixers, high pressure homogenizers, ball mills, attrition equipment, sand mills, and horizontal and vertical wet grinding mills, and the like.

By one approach, the conductive layer 410 can be formed using one or more of the following methods, including, but not limited to, painting, coating, printing, pouring, spin casting, solution casting, dip coating, powder coating, by syringe or pipette, spray coating, curtain coating, lamination, co-extrusion, spray coating, electrospray deposition, ink-jet printing, spin coating, thermal transfer (including laser transfer) methods, screen printing, rotary screen printing, gravure printing, capillary printing, offset printing, electrohydrodynamic (EHD) printing (as disclosed in WO 2007/053621, which is herein incorporated by reference in its entirety), flexographic printing, pad printing, stamping, microcontact printing, dip pen nanolithography, laser printing, via pen or similar means, and the like.

After one or more layers are formed, the layer may be cured using any suitable technique, including drying and oven-drying (in air or another inert or reactive atmosphere), UV curing, IR curing, microwave curing or drying, and the like.

Figure 5:
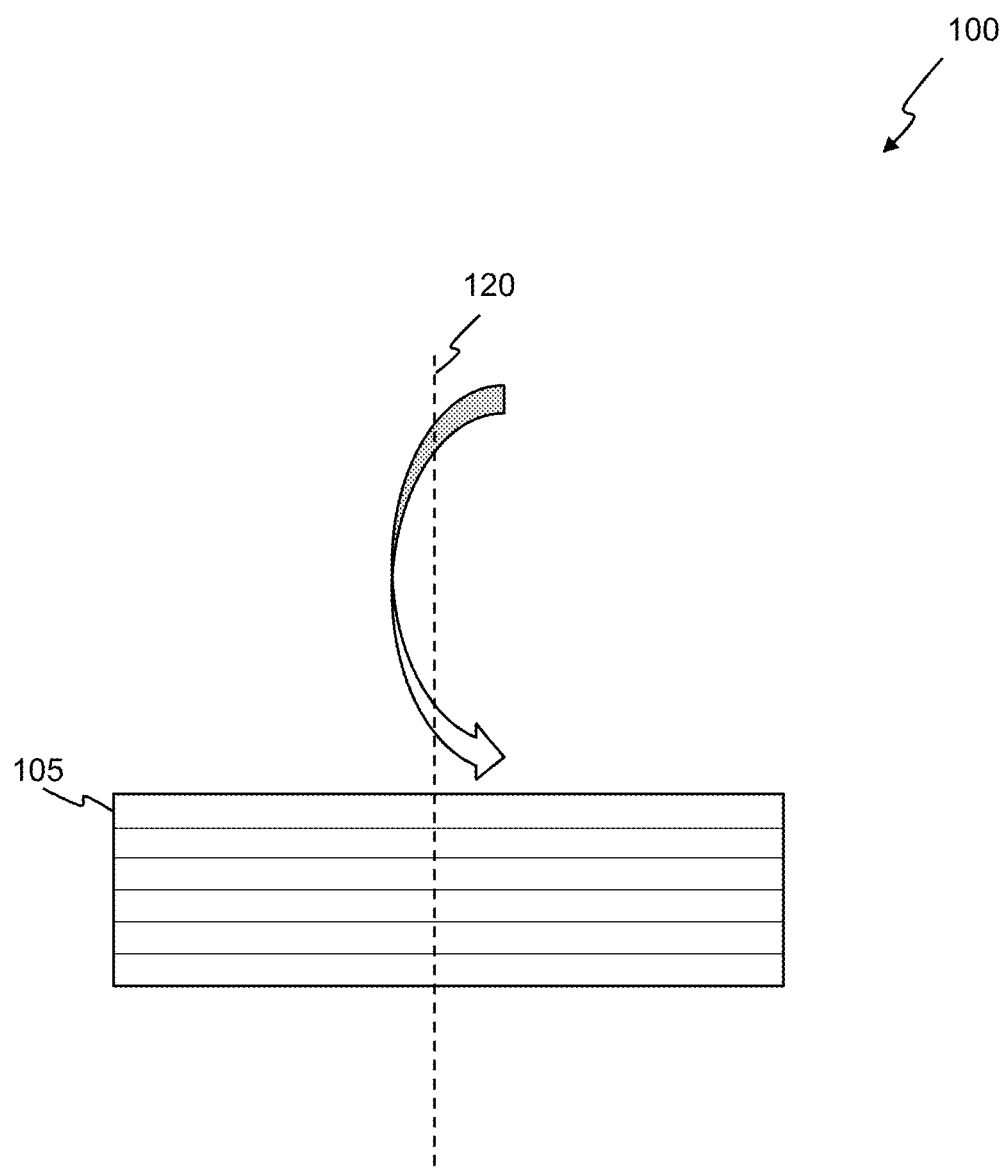
FIG. 5 illustrates a side view of the HES structure 100 in a folded state, in accordance with yet still some embodiments.
Figure 6:
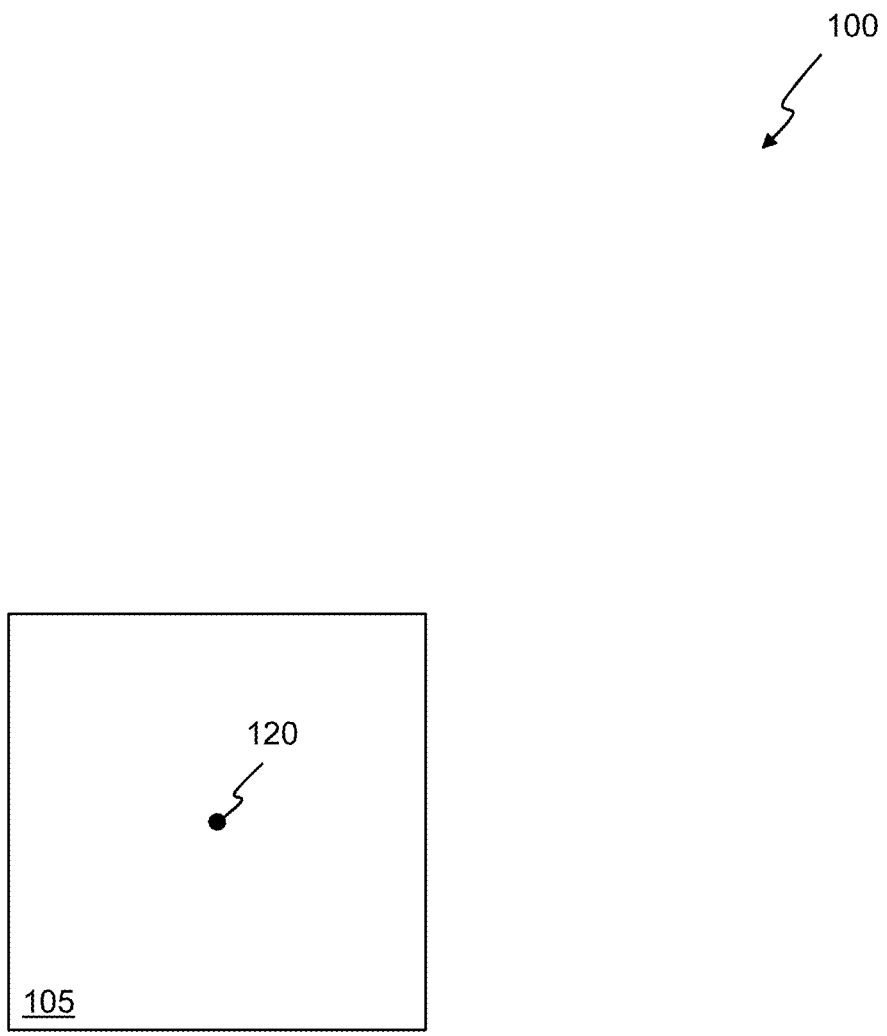
FIG. 6 illustrates a top view of the HES structure 100 in the folded state, in accordance with other embodiments.
Figure 7:
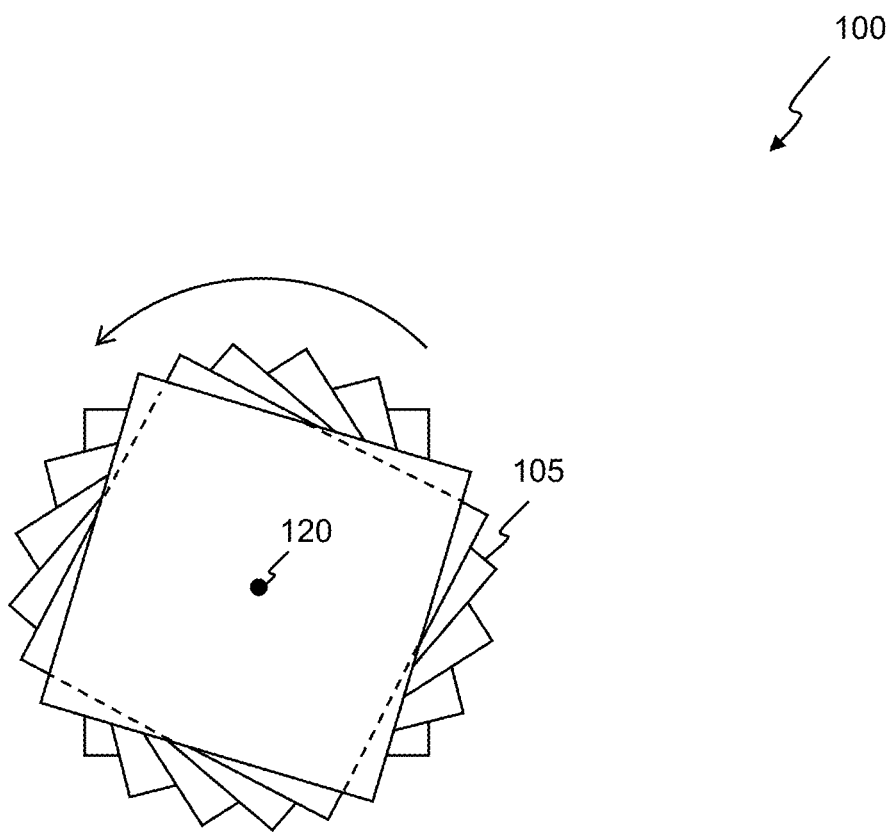
FIG. 7 illustrates a top view of the HES structure 100 in the unfolded state, in accordance with certain embodiments.

FIG. 5 illustrates a side view of the HES structure 100 in a folded state, in accordance with yet still some embodiments. In the folded state, the plurality of interconnected EMI shielding planes 105 are aligned with each other, as illustrated in the top view of the HES structure 100 reflected in FIG. 6. As illustrated in the top view reflected in FIG. 7, the plurality of interconnected EMI shielding planes 105 each axially rotate about the center axis 120 when the HES structure 100 transitions between the folded state and unfolded state.

Figure 8:
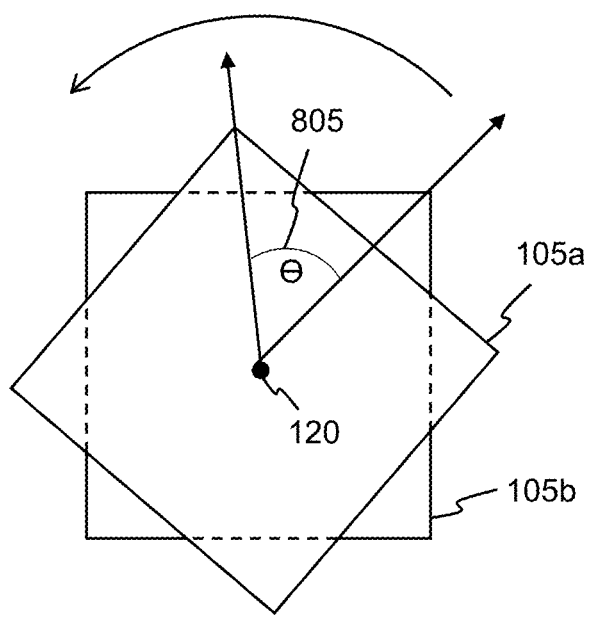
FIG. 8 illustrates a top view of the angular offset, generally 805, of two interconnected EMI shielding planes, generally 105a and 105b, in accordance with yet still other embodiments.

As illustrated in FIG. 8, the angular offset 805 between adjacent EMI shielding planes 105 (e.g., EMI shielding plane 105a and EMI shielding plane 105b) increases as the distance between the adjacent EMI shielding structures increases and decreases when the distance decreases. In other words, the angular offset 805 increases as the HES structure 100 transitions from the folded state to the unfolded state and decreases when transitioning from the unfolded state to the folded state.

In other embodiments, the HES structures 100 can be arranged in a plurality of rows and columns to form an EMI shielding construct that has a 3D geometric shape. The EMI shielding constructs can be in the form of blocks, walls, dividers, and/or panels that are, for example, used to form EMI shielding structures having a roof and/or walls. In other words, the thus formed EMI shielding structures provide an EMI shielded space that protects electronic devices and circuits from EMI radiation.

Figure 9:
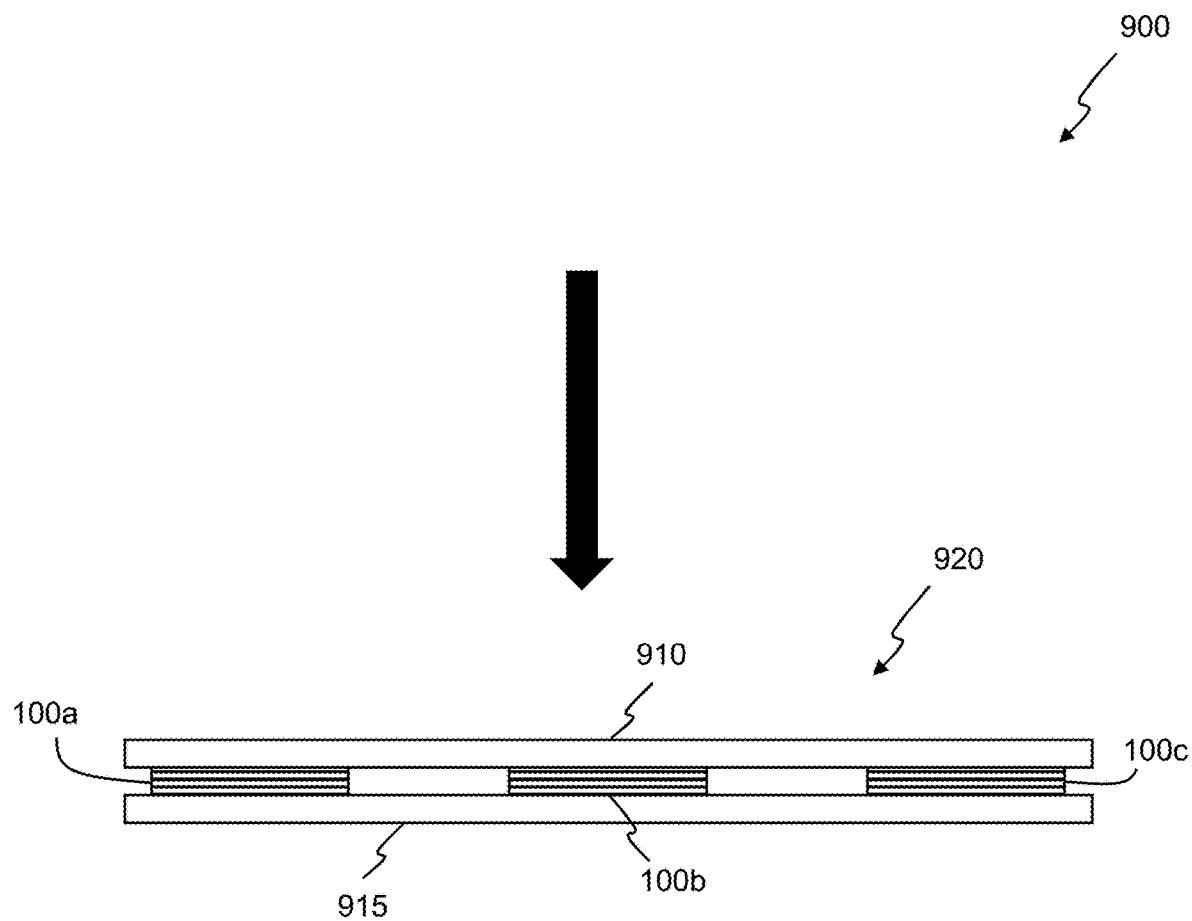
FIG. 9 illustrates a side view of an EMI shielding construct, generally 900, in a folded state, in accordance with some embodiments.

FIG. 9 illustrates a side view of an EMI shielding construct, generally 900, in a folded state 920, in accordance with some embodiments. The EMI shielding construct 900 includes a plurality of HES structures 100 (e.g., the HES structures 100a, 100b, and 100c) that are rigidly affixed to a first rigid panel 910 via their first end 110 and rotatably affixed to a second rigid panel 915 via their second end 115. Alternatively, the panel 910 and/or the panel 915 can be flexible. Alternatively, the first end 110 can be rotatably affixed and the second end 115 can be rigidly affixed. To be sure, one end of each HES structure 100 must be affixed to allow rotation about the central axis 120.

Figure 10:
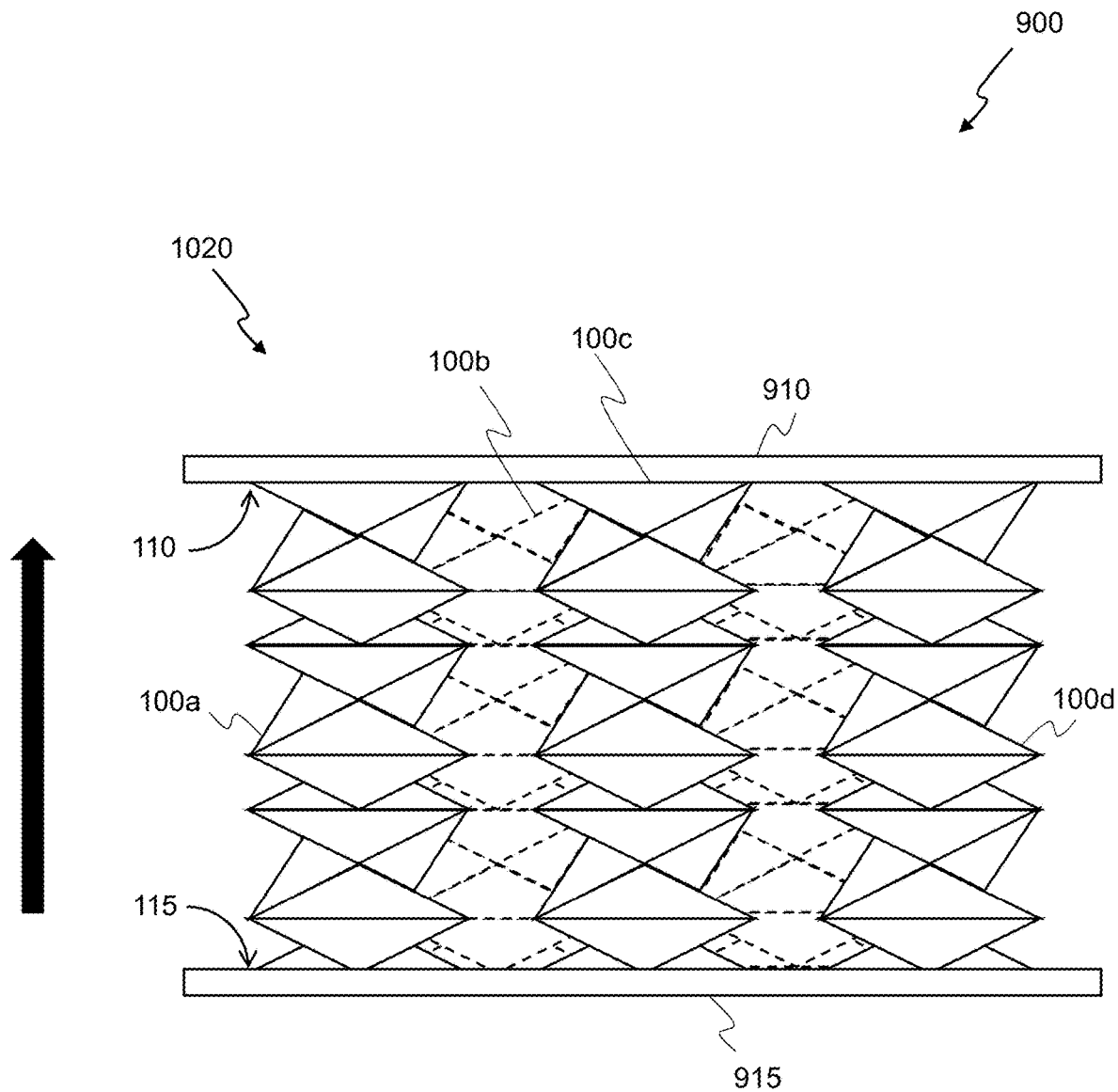
FIG. 10 illustrates a side view of the EMI shielding construct 900, in an unfolded state, in accordance with other embodiments.

FIG. 10 illustrates a side view of the EMI shielding construct 900, in an unfolded state 1020, in accordance with other embodiments. Here, the plurality of HES structures 100 are longitudinally positioned side by side in one or more rows and columns to thereby form the EMI shielding construct 900. Although depicted as uniform in width, the plurality of HES structures 100 can have different widths to conform to any predetermined geometric configuration. The plurality of HES structures 100 are preferably arranged to eliminate gaps therebetween that may be present when in the unfolded state to thereby form a barrier that blocks and/or absorbs EMI radiation. Turning now to alternative views and configurations of EMI constructs.

Figure 11:
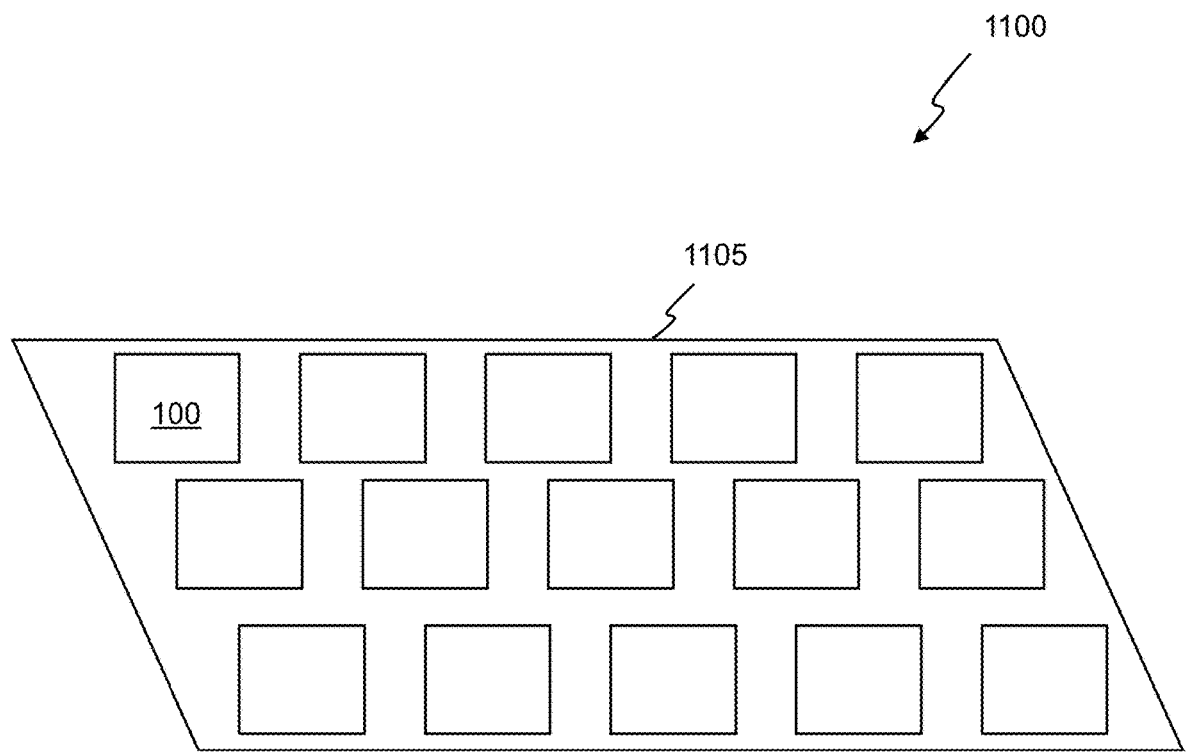
FIG. 11 illustrates a top view of an EMI shielding construct, generally 1100, in accordance with certain embodiments.

FIG. 11 illustrates a top view of an EMI shielding construct, generally 1100, in accordance with certain embodiments. Here, the top view illustrates the plurality of HES structures 100 longitudinally arranged in rows and columns in the form of a parallelogram configuration to thereby form the EMI shielding construct 1100. In some embodiments, the EMI shielding constructs (e.g., EMI shielding construct 1100) contains an outer shell (e.g., a shell 1105) that may provide structural integrity and/or additional EMI shielding protection.

Figure 12:
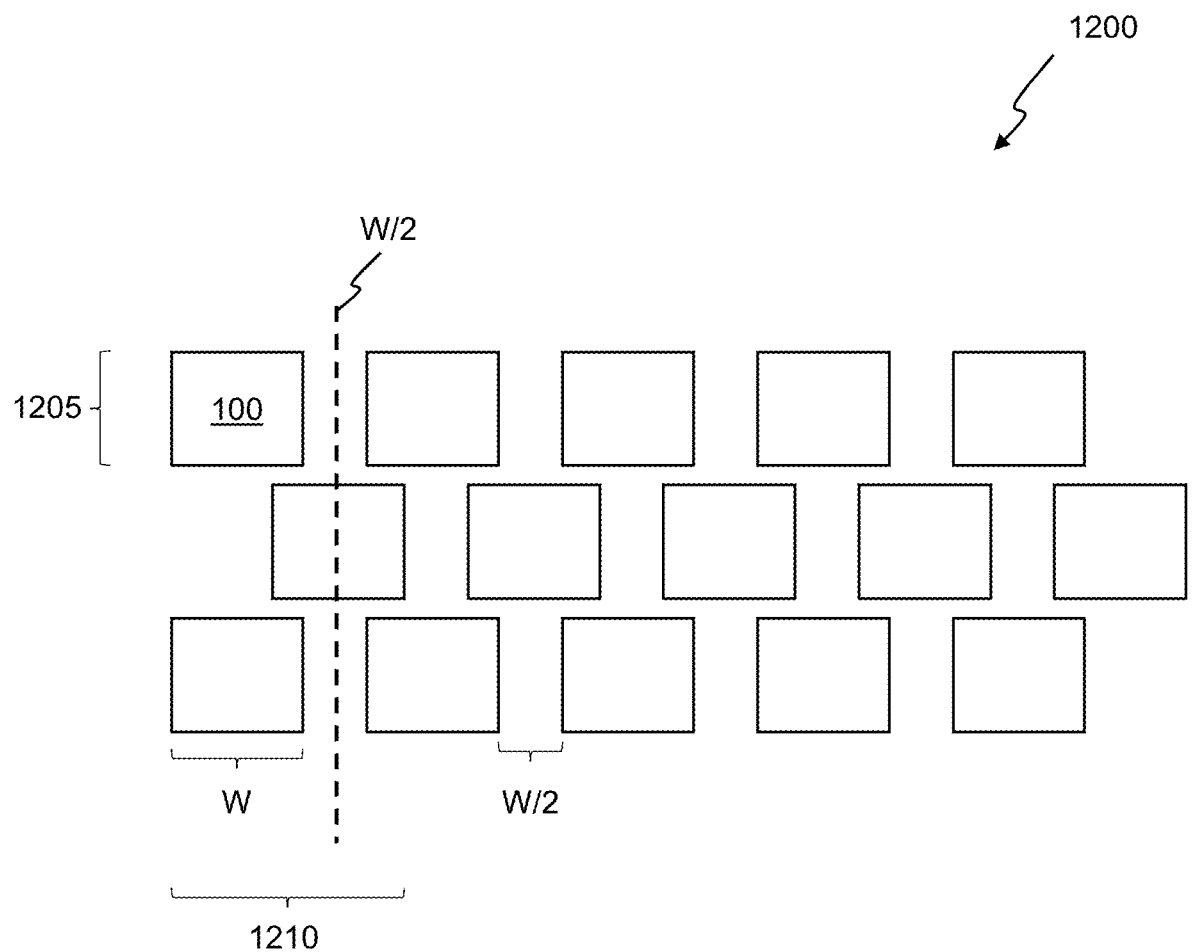
FIG. 12 illustrates an EMI shielding assembly, generally 1200, that includes a plurality of HES structures 100 arranged in rows and columns with an L/2 spacing, in accordance with yet still other embodiments.
Figure 13:
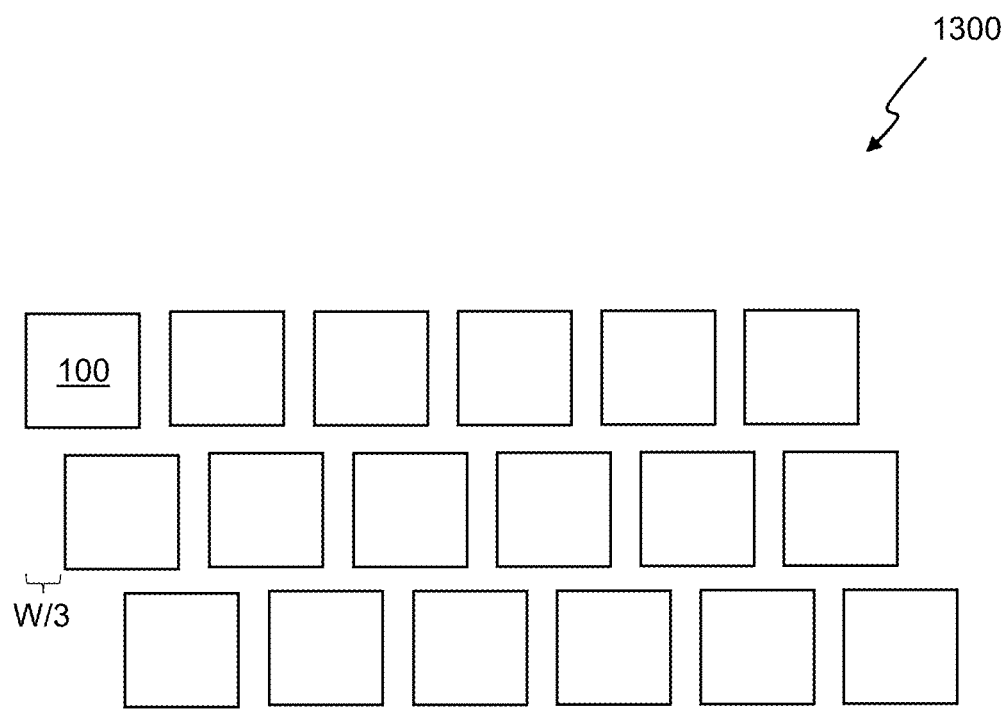
FIG. 13 illustrates an EMI shielding assembly, generally 1300, that includes a plurality of HES structures 100 arranged in rows and columns with an L/3 spacing, in accordance with some embodiments.

The plurality of HES structures 100 are preferably spaced apart according to their width to minimize and/or eliminate the aforementioned potential gaps. Applicable spacing includes, but is not limited to W/8-W/9, wherein W is the width of the HES structure 100. FIG. 12 illustrates a top view of an EMI shielding assembly, generally 1200, that includes a plurality of HES structures 100 arranged in rows 1205 and columns 1210 with a W/2 spacing, in accordance with yet still other embodiments. FIG. 13 illustrates a top view of an EMI shielding assembly, generally 1300, that includes a plurality of HES structures 100 arranged in rows and columns with a W/3 spacing, in accordance with some embodiments.

Figure 14:
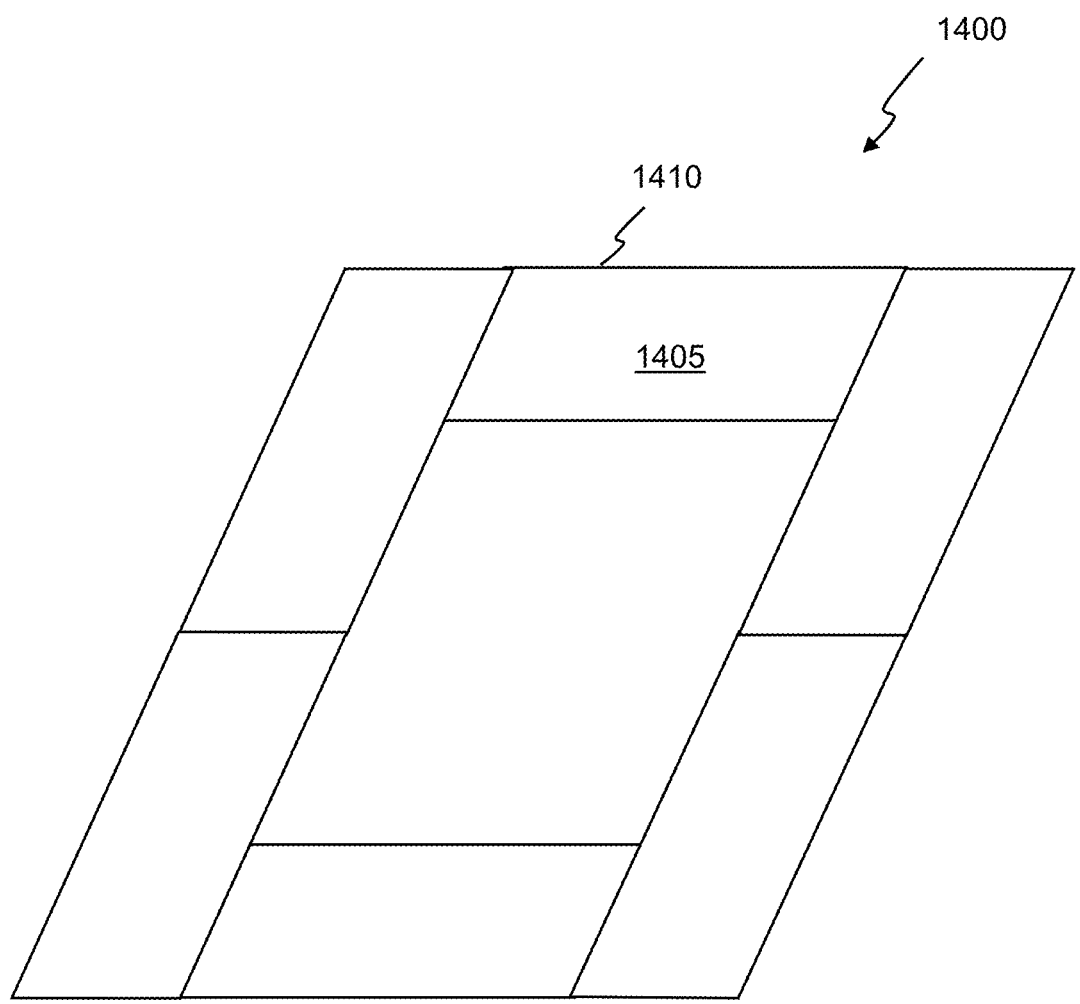
FIG. 14 illustrates an EMI shielding structure, generally 1400, that includes a plurality of EMI shielding constructs, generally 1405, arranged in a parallelogram, in accordance with other embodiments.
Figure 15:
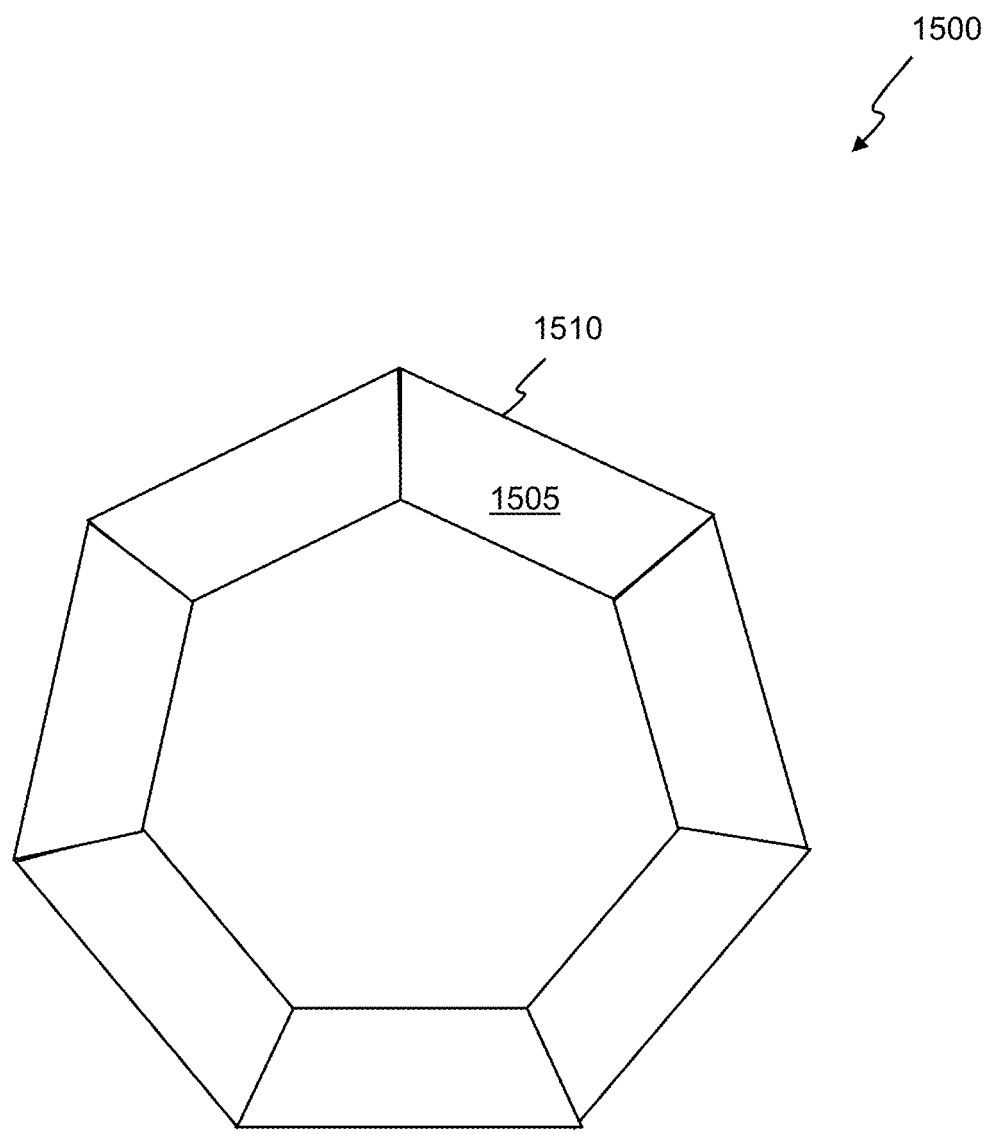
FIG. 15 illustrates an EMI shielding structure, generally 1500, that includes a plurality of EMI shielding constructs, generally 1505, arranged in a septagon, in accordance with certain embodiments.

FIG. 14 illustrates a top view of an EMI shielding structure, generally 1400, that includes a plurality of EMI shielding constructs, generally 1405, arranged in a parallelogram configuration, in accordance with other embodiments. The EMI shielding construct 1405 includes a shell 1410. Although not depicted, the EMI shielding structure 1400 can include an EMI shielding roof (e.g., an EMI shielding panel horizontally positioned on the EMI shielding structure 1400). FIG. 15 illustrates a top view of an EMI shielding structure, generally 1500, that includes a plurality of EMI shielding constructs, generally 1505, arranged in a septagonal configuration, in accordance with certain embodiments. The EMI shielding construct 1505 includes a shell 1510. Although not depicted, the EMI shielding structure 1500 can include an EMI shielding roof (e.g., an EMI shielding panel horizontally positioned on the EMI shielding structure 1500.

Figure 16:
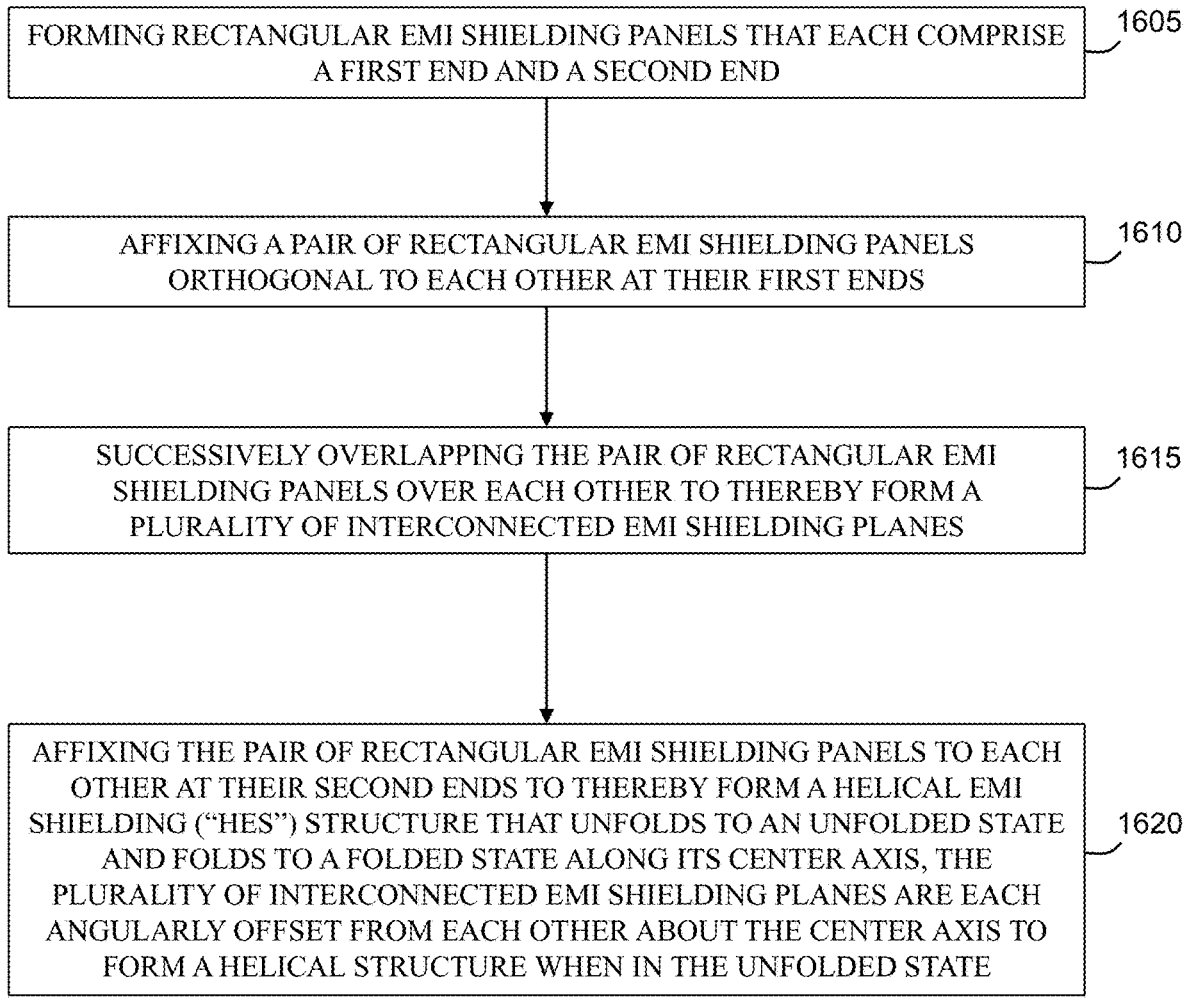
FIG. 16 depicts the method steps to form an EMI structure, in accordance with yet still other embodiments.

FIG. 16 depicts the method steps to form an EMI structure 100, in accordance with yet still other embodiments. At Step 1605, rectangular EMI shielding panels 200 are formed that each include a first end 205 and a second end 210. At Step 1610, a pair of rectangular EMI shielding panels 200 are affixed orthogonal to each other at their first ends 205 (e.g., see FIG. 2). At Step 1615, the pair of rectangular EMI shielding panels 200 are successively overlapped with each other to thereby form a plurality of interconnected EMI shielding planes 105 (e.g., see FIG. 5).

At Step 1620, the pair of rectangular EMI shielding panels 200 are affixed to each other at their second ends 210 (e.g., the second end 210a and the second end 210b) to thereby form a helical EMI shielding ("HES") structure 100 that unfolds to an unfolded state 130 (e.g., see FIG. 1) and folds to a folded state 505 (e.g., see FIG. 5) along its center axis 120. Here, the plurality of interconnected EMI shielding planes 105 are each angularly offset from each other (e.g., via angular offset 805) about the center axis 120 to form a helical structure 125 when in the unfolded state 130.

The encapsulating layer 410 includes PET, polyetherimides, PU, thermoplastic polyurethane (TPU), ABS, PVC, nylon, PLA, polybenzimidazole, polycarbonate, polyether sulfone, polyoxymethylene, polyether ether ketone, polyetherimide, polyethylenes, polypropylene, polystyrene, polyvinyl chloride, polyvinylidene fluoride, Teflon, and/or other thermoplastic films known in the art.

Figure 17:
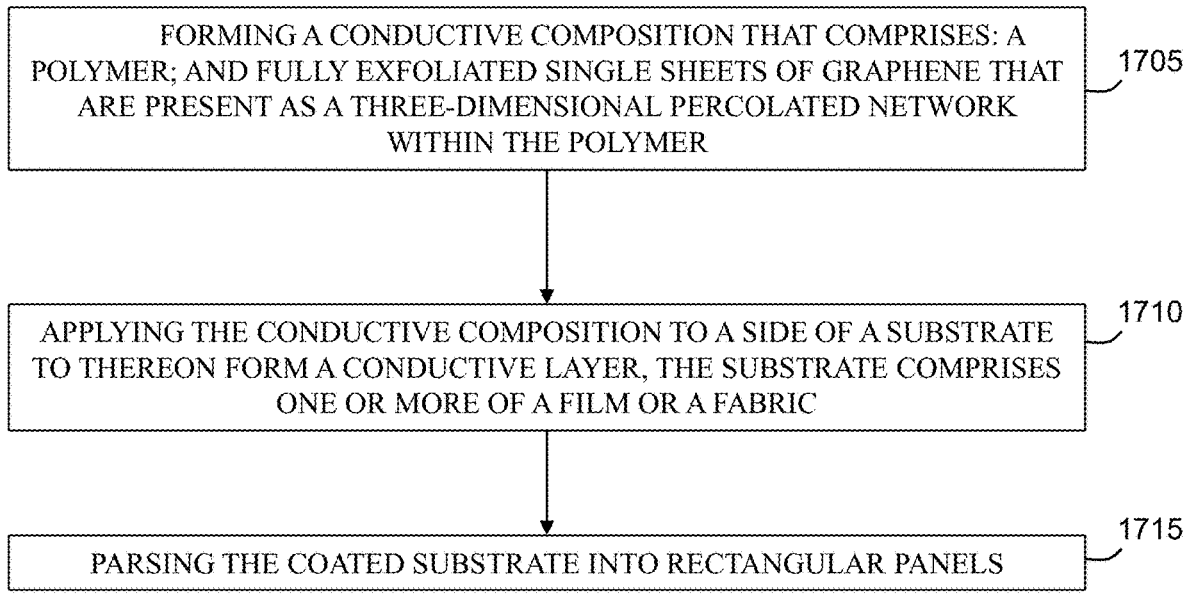
FIG. 17 depicts additional method steps to form an EMI structure, in accordance with some embodiments.

The metallic layer 420 is preferably in the form of a metallic film, metallic screen/mesh and/or a metallic fiber. Applicable metals include, but are not limited to, silver, gold, copper, aluminum, steel, zinc, nickel, titanium, and/or an alloy. To be sure, the metallic layer 420 provides additional structural integrity to the HES structure 100. FIG. 17 depicts additional method steps to form the EMI structure of FIG. 16, in accordance with some embodiments. At Step 1705, a conductive composition is formed that includes a polymer and fully exfoliated single sheets of graphene that are present as a three-dimensional percolated network within the polymer. At Step 1710, to form the rectangular EMI shielding panels of Step 1605, the conductive composition is applied to a side 406 (or a side 407) of a substrate 405 to thereon form a conductive layer 410.

Here, the substrate 405 includes one or more of a film or a fabric. Applicable films include, but are not limited to, polymeric films such as those that include polyethylene terephthalate (PET), polyethylene, polyetherimides, polyurethanes (PU), and/or similar thermoplastics. Applicable fabrics include, but are not limited to, polymeric fabrics such as those that include nylon and/or rayon, natural fabrics as well as those that include silver, copper, nickel, aluminum, zinc, brass and/or steel. Such fabrics can be woven or non-woven. In certain embodiments, the substrate 405 is in the form of a mesh. At Step 1715, the coated substrate 405 is parsed into rectangular panels 200.

Figure 18:
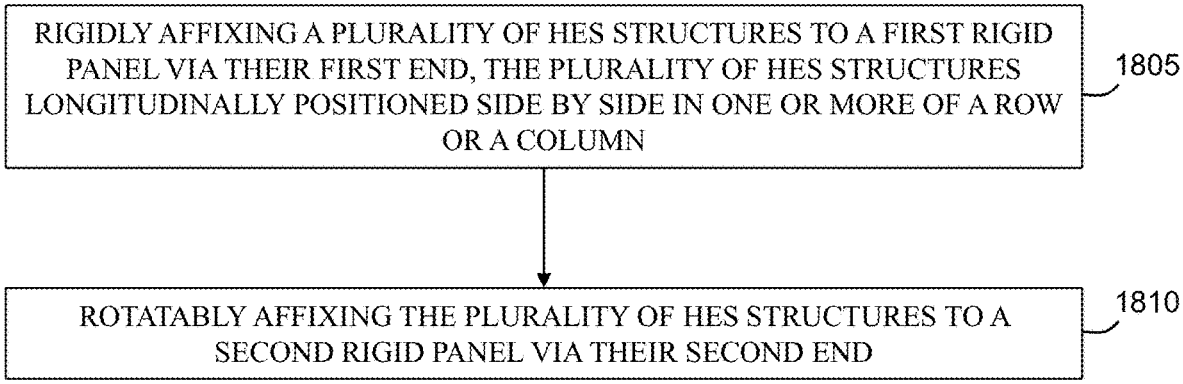
FIG. 18 depicts additional method steps to form an EMI structure, in accordance with other embodiments.

FIG. 18 depicts additional method steps to form an EMI shielding structure 100, in accordance with other embodiments. At Step 1805, a plurality of HES structures 100 are rigidly affixed to a first rigid panel 910 via a top end 110, the plurality of HES structures 100 longitudinally positioned side by side in one or more of a row 1205 or a column 1210. At Step 1810, the plurality of HES structures is rotatably affixed to a second rigid panel 915 via a bottom end 115.

Figure 19:
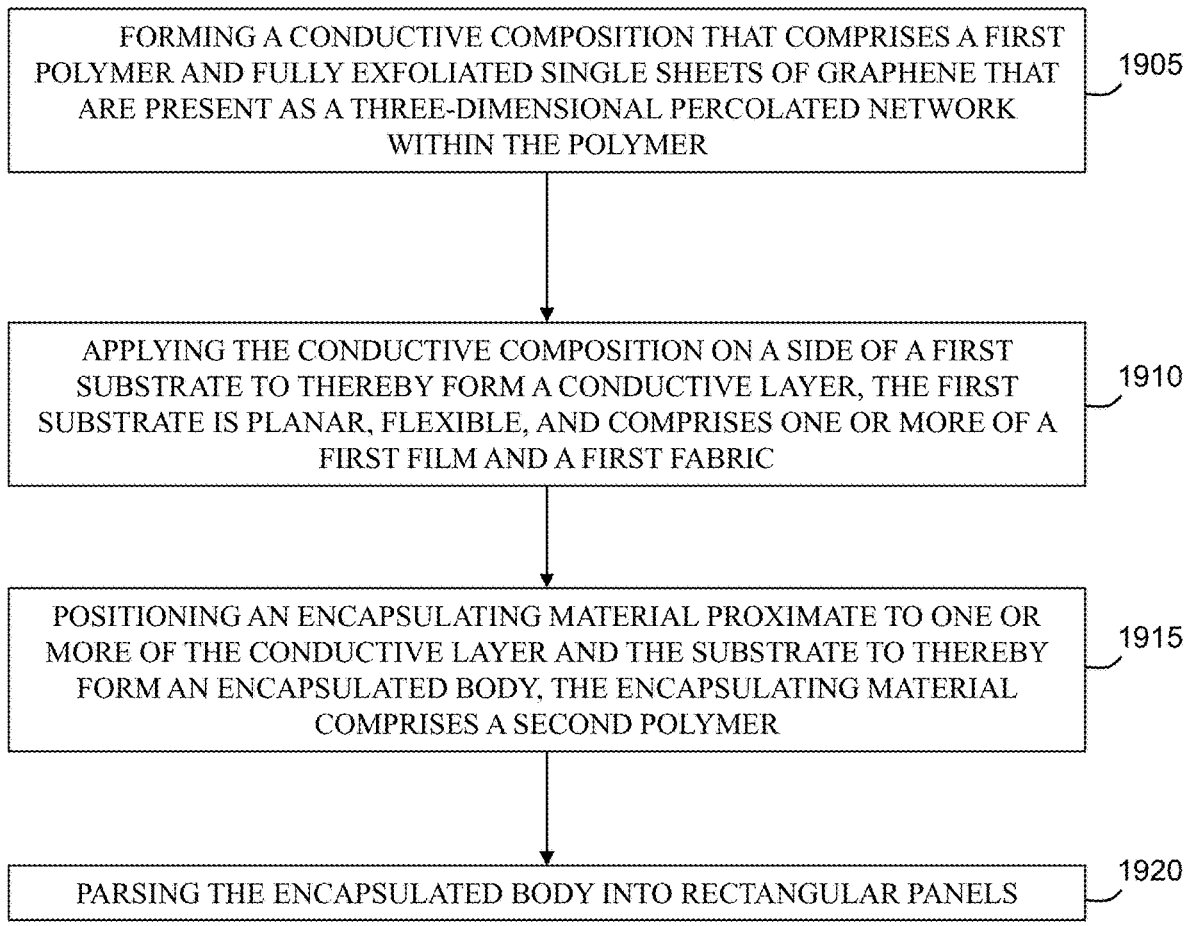
FIG. 19 depicts additional method steps to form an EMI structure, in accordance with certain embodiments.

FIG. 19 depicts additional method steps to form an EMI shielding structure 100, in accordance with certain embodiments. At Step 1905, a conductive composition is formed (e.g., using one or more of the aforementioned techniques) that includes a polymer and fully exfoliated single sheets of graphene that are present as a three-dimensional percolated network within the polymer. At Step 1910, to form the rectangular EMI shielding panels 200 of Step 1605, the conductive composition is applied on a side 406 (or a side 407) of a substrate 405 to thereon form a conductive layer 410, the substrate 405 is planar, flexible, and includes one or more of a first film and a first fabric. At Step 1915, an encapsulating layer 415 is positioned proximate to one or more of the conductive layer 410 and the substrate 405 to thereby form an encapsulated body 425.

Figure 20:
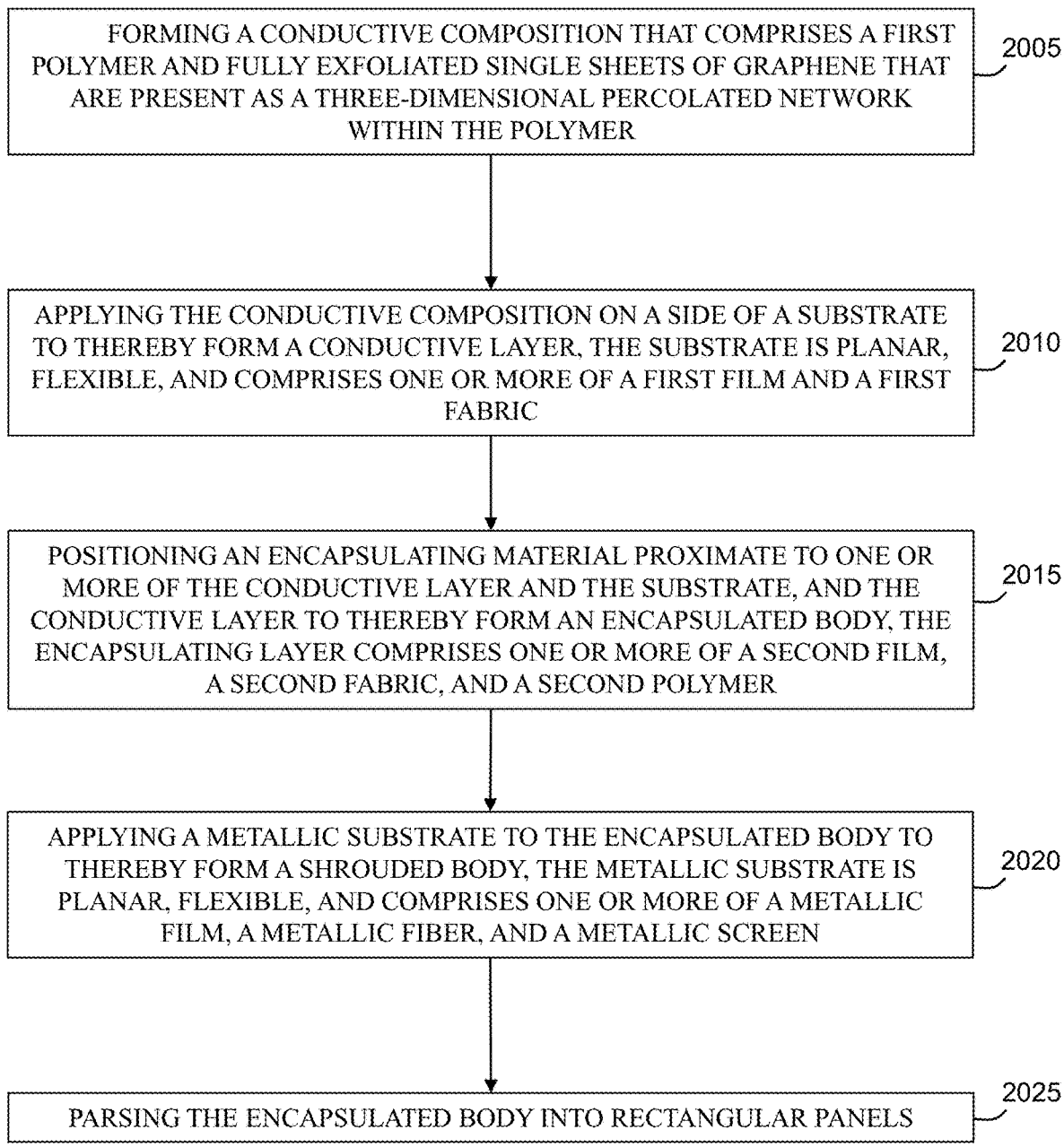
FIG. 20 depicts additional method steps to form an EMI structure, in accordance with yet still other embodiments.

Here, the encapsulating layer 415 includes one or more of a film, a fabric, a polymer. At Step 1920, the encapsulated body 425 is parsed into rectangular panels 200. FIG. 20 depicts additional method steps to form an EMI shielding structure 100, in accordance with yet still other embodiments. A Step 2005, a conductive composition is formed (e.g., using one or more of the aforementioned techniques) that includes a polymer and fully exfoliated single sheets of graphene that are present as a three-dimensional percolated network within the polymer. At Step 2010, to form the rectangular EMI shielding panels (Step 1605), the conductive composition is applied on a side 406 (and/or a side 407) of a substrate 405 to thereon form a conductive layer 410. Here, the substrate 405 is preferably planar, flexible, and includes one or more of a film and a fabric.

At Step 2010, an encapsulating layer 415 is positioned proximate to one or more of the conductive layer 410 and the substrate 405 to thereby form an encapsulated body 425. Here, the encapsulating layer 415 includes one or more of a film, a fabric, and a polymer. At Step 2015, a metallic layer 420 is applied to the encapsulated body 425 to thereby form a shrouded body 430. Here, the metallic layer 420 is planar, flexible, and includes one or more of a metallic film, metallic fiber, and a metallic screen. At Step 2025, the shrouded body is parsed into rectangular panels 200.

Based on the foregoing, a HES structure and associated methods of manufacture have been disclosed in accordance with the instant disclosure. However, numerous modifications and substitutions can be made without deviating from the scope of the instant disclosure. Therefore, the instant disclosure has been presented by way of example and not limitation.

The invention claimed is:

1. A method of forming EMI shielding structures, comprising:
    forming rectangular EMI shielding panels that each comprise a first end and a second end;
    affixing a pair of rectangular EMI shielding panels orthogonal to each other at their first ends;
    successively overlapping the pair of rectangular EMI shielding panels over each other to thereby form a plurality of interconnected EMI shielding planes; and
    affixing the pair of rectangular EMI shielding panels to each other at their second ends to thereby form a helical EMI shielding ("HES") structure that unfolds to an unfolded state and folds to a folded state along its center axis, the plurality of interconnected EMI shielding planes are each angularly offset from each other about the center axis to form a helical structure when in the unfolded state.

2. The method of forming electromagnetic interference ("EMI") shielding structures of claim 1, further comprising:
    forming a conductive composition that comprises:
        a polymer;
        fully exfoliated single sheets of graphene that are present as a three-dimensional percolated network within the polymer;
    wherein
        forming the rectangular EMI shielding panels comprises:
            applying the conductive composition to a side of a substrate to thereon form a conductive layer, the substrate comprises one or more of a film or a fabric; and
            parsing the coated substrate into rectangular panels.

3. The method of forming EMI shielding structures of claim 1, wherein
    the plurality of interconnected EMI shielding planes each rotate about the center axis when the HES structure transitions between the folded state and unfolded state.

4. The method of forming EMI shielding structures of claim 1, wherein
the angular offset between adjacent EMI shielding planes increases as the distance between the adjacent EMI shielding structures increases.

5. The method of forming EMI shielding structures of claim 1, wherein
the plurality of interconnected EMI shielding planes each axially rotate about the center axis when the HES structure transitions between the unfolded state and the folded state.

6. The method of forming the EMI shielding structures of claim 1, further comprising:
rigidly affixing a plurality of HES structures to a first rigid panel via a top end, the plurality of HES structures longitudinally positioned side by side in one or more of a row or a column; and
rotatably affixing the plurality of HES structures to a second rigid panel via a bottom end.

7. The method of forming the EMI shielding structures of claim 1, further comprising:
forming a conductive composition that comprises:
a first polymer;
fully exfoliated single sheets of graphene that are present as a three-dimensional percolated network within the polymer;
wherein
forming the rectangular EMI shielding panels comprises:
applying the conductive composition on a side of a substrate to thereon form a conductive layer, the substrate is planar, flexible, and comprises one or more of a first film and a first fabric;
positioning an encapsulating layer proximate to one or more of the conductive layer the substrate, and the conductive layer to thereby form an encapsulated body, the encapsulating layer comprises one or more of a second film, a second fabric, a second polymer; and
parsing the encapsulated body into rectangular panels.

8. The method of forming the EMI shielding structures of claim 1, further comprising:
forming a conductive composition that comprises:
a first polymer;
fully exfoliated single sheets of graphene that are present as a three-dimensional percolated network within the polymer;
wherein
forming the rectangular EMI shielding panels comprises:
applying the conductive composition on a side of a substrate to thereon form a conductive layer, the substrate is planar, flexible, and comprises one or more of a first film and a first fabric;
positioning an encapsulating layer proximate to one or more of the conductive layer and the substrate to thereby form an encapsulated body, the encapsulating layer comprises one or more of a second film, a second fabric, and a second polymer;
applying a metallic layer to the encapsulated body to thereby form a shrouded body, the metallic layer is planar, flexible, and comprises one or more of a metallic film, metallic fiber, and a metallic screen; and
parsing the shrouded body into rectangular panels.

9. A electromagnetic interference ("EMI") shielding structure, comprising:
a plurality of interconnected EMI shielding planes;
a conductive composition;
wherein
the plurality of interconnected EMI shielding planes comprise:
a pair of rectangular EMI shielding panels that each comprise a first end and a second end;
are affixed orthogonal to each other at their first ends;
successively overlap each other to thereby form a plurality of interconnected EMI shielding planes;
affixed at their second ends to thereby form a helical EMI shielding ("HES") structure;
the HES structure unfolds to an unfolded state and folds to a folded state along its center axis;
the conductive composition is positioned on each EMI shielding panel; and
the plurality of interconnected EMI shielding planes are each angularly offset from each other about the center axis to form a helical structure when in the unfolded state.

10. The EMI shielding structure of claim 9, wherein
the rectangular EMI shielding panels comprises:
a substrate;
a conductive layer;
the substrate comprises
a rectangular shape;
one or more of a film or a fabric;
the conductive layer
is positioned proximate to the substrate;
comprises a conductive composition;
the conductive composition comprises:
a polymer; and
fully exfoliated single sheets of graphene that are present as a three-dimensional percolated network within the polymer.

11. The EMI shielding structure of claim 9, wherein
the plurality of interconnected EMI shielding planes each rotate about the center axis when the HES structure transitions between the folded state and unfolded state.

12. The EMI shielding structure of claim 9, wherein
the angular offset between adjacent EMI shielding planes increases as the distance between the adjacent EMI shielding structures increases.

13. The EMI shielding structure of claim 9, wherein
the plurality of interconnected EMI shielding planes each axially rotate about the center axis when the HES structure transitions between the unfolded state and the folded state.

14. The EMI shielding structure of claim 9, further comprising:
a plurality of HES structures that are
rigidly affixed to a first rigid panel via their first end;
rotatably affixed to a second rigid panel via their second end; and
wherein
the plurality of HES structures are longitudinally positioned side by side in one or more of a row or a column to thereby form an EMI shielding construct.

15. The EMI shielding structure of claim 9, wherein
each rectangular EMI shielding panel comprises:
a substrate that comprises one or more of a first film and a first fabric;
a conductive layer;
an encapsulating layer;
the conductive layer is positioned proximate to a side of the first substrate;
comprises:
a first polymer;
fully exfoliated single sheets of graphene;
the fully exfoliated single sheets of graphene are present as a three-dimensional percolated network within the polymer;
the encapsulating layer
comprises one or more of a second film, a second fabric, a second polymer; and
is positioned proximate to one or more of the conductive layer, the substrate, and the conductive layer.

16. The EMI shielding structure of claim 9, wherein each rectangular EMI shielding panel comprises:
a substrate that comprises one or more of a first film and a first fabric;
an encapsulating layer;
a conductive layer;
a metallic layer;
the conductive layer
is positioned proximate to each side of the first substrate;
comprises:
a first polymer;
fully exfoliated single sheets of graphene;
the fully exfoliated single sheets of graphene are present as a three-dimensional percolated network within the polymer;
the encapsulating material comprises one or more of a second film, a second fabric, a second polymer;
is positioned proximate to one or more of the conductive layer, the substrate, and the conductive layer;
the metallic substrate
comprises one or more of a metallic film and a metallic fabric; and
is positioned proximate to one or more of the conductive layer, the substrate, the conductive layer, and the encapsulating material.

17. A method of forming EMI shielding structures, comprising:
forming a conductive composition that comprises:
a polymer;
fully exfoliated single sheets of graphene that are present as a three-dimensional percolated network within the polymer;
forming rectangular EMI shielding panels that each comprise a first end and a second end by applying the conductive composition to a side of a substrate to thereon form a conductive layer, the substrate is planar and flexible, the substrate comprises one or more of a film or a fabric;
affixing a pair of rectangular EMI shielding panels orthogonal to each other at their first ends;
successively overlapping the pair of rectangular EMI shielding panels over each other to thereby form a plurality of interconnected EMI shielding planes; and
affixing the pair of rectangular EMI shielding panels to each other at their second ends to thereby form a helical EMI shielding ("HES") structure that unfolds to an unfolded state and folds to a folded state along its center axis, the plurality of interconnected EMI shielding planes are each angularly offset from each other about the center axis to form a helical structure when in the unfolded state, the plurality of interconnected EMI shielding planes each rotate about the center axis when the HES structure transitions between the folded state and unfolded state.

18. The method of forming the EMI shielding structures of claim 17, further comprising:
rigidly affixing a plurality of HES structures to a first rigid panel via a top end, the plurality of HES structures longitudinally positioned side by side in one or more of a row or a column; and
rotatably affixing the plurality of HES structures to a second rigid panel via a bottom end.

19. The method of forming the EMI shielding structures of claim 18, wherein
forming the rectangular EMI shielding panels comprises:
positioning an encapsulating layer proximate to one or more of the conductive layer the substrate, and the conductive layer to thereby form an encapsulated body, the encapsulating layer comprises one or more of a second film, a second fabric, a second polymer; and
parsing the encapsulated body into rectangular panels.

* * * * *